United States Patent
Stoddard et al.

(10) Patent No.: US 6,756,854 B2
(45) Date of Patent: Jun. 29, 2004

(54) DIGITALLY CONTROLLED ANGLE NOISE SIGNAL GENERATOR

(75) Inventors: Robert Eugene Stoddard, Sunnyvale, CA (US); Michael Shaw McKinley, Sunnyvale, CA (US); John Lorin Anderson, San Jose, CA (US)

(73) Assignee: Aeroflex Powell, Inc., Powell, OH (US)

( * ) Notice: Subject to any disclaimer, the term of this patent is extended or adjusted under 35 U.S.C. 154(b) by 41 days.

(21) Appl. No.: 10/284,911

(22) Filed: Oct. 31, 2002

(65) Prior Publication Data

US 2004/0085143 A1 May 6, 2004

(51) Int. Cl.$^7$ ............................................. H03B 29/00
(52) U.S. Cl. ........................................... 331/78; 331/74
(58) Field of Search ............................ 331/44, 74, 78, 331/175, 177 R

(56) References Cited

U.S. PATENT DOCUMENTS

| | | | |
|---|---|---|---|
| 5,491,458 A | * | 2/1996 | McCune et al. ............ 332/144 |
| 6,072,371 A | | 6/2000 | Kobayashi et al. |
| 6,167,359 A | | 12/2000 | Demir et al. |
| 6,175,284 B1 | | 1/2001 | Sakurai et al. |
| 6,236,275 B1 | | 5/2001 | Dent |
| 6,313,619 B1 | | 11/2001 | Roth |

OTHER PUBLICATIONS

Wenzel, Charles, Audio Noise Sources for Generating Phase Noise, Web address http://www.wenzel.com/pdffiles/noise.pdf.

* cited by examiner

*Primary Examiner*—David Mis
(74) *Attorney, Agent, or Firm*—David E. Lovejoy

(57) ABSTRACT

A digitally controlled angle noise signal generator for generating a signal with precise and accurate noise. The signal generator is formed of a digital noise generator for generating a digital noise signal $\theta_N$, and a digital signal generator for forming an internal signal S. The digital signal generator receives the digital noise signal $\phi_N$ and modulates the internal signal S with the digital noise signal $\phi_N$ to generate a digitally controlled signal $y_g = S m\{\theta_N\}$, where $m$ is the modulation operator, with precise and accurate noise.

22 Claims, 4 Drawing Sheets

FIG. 3

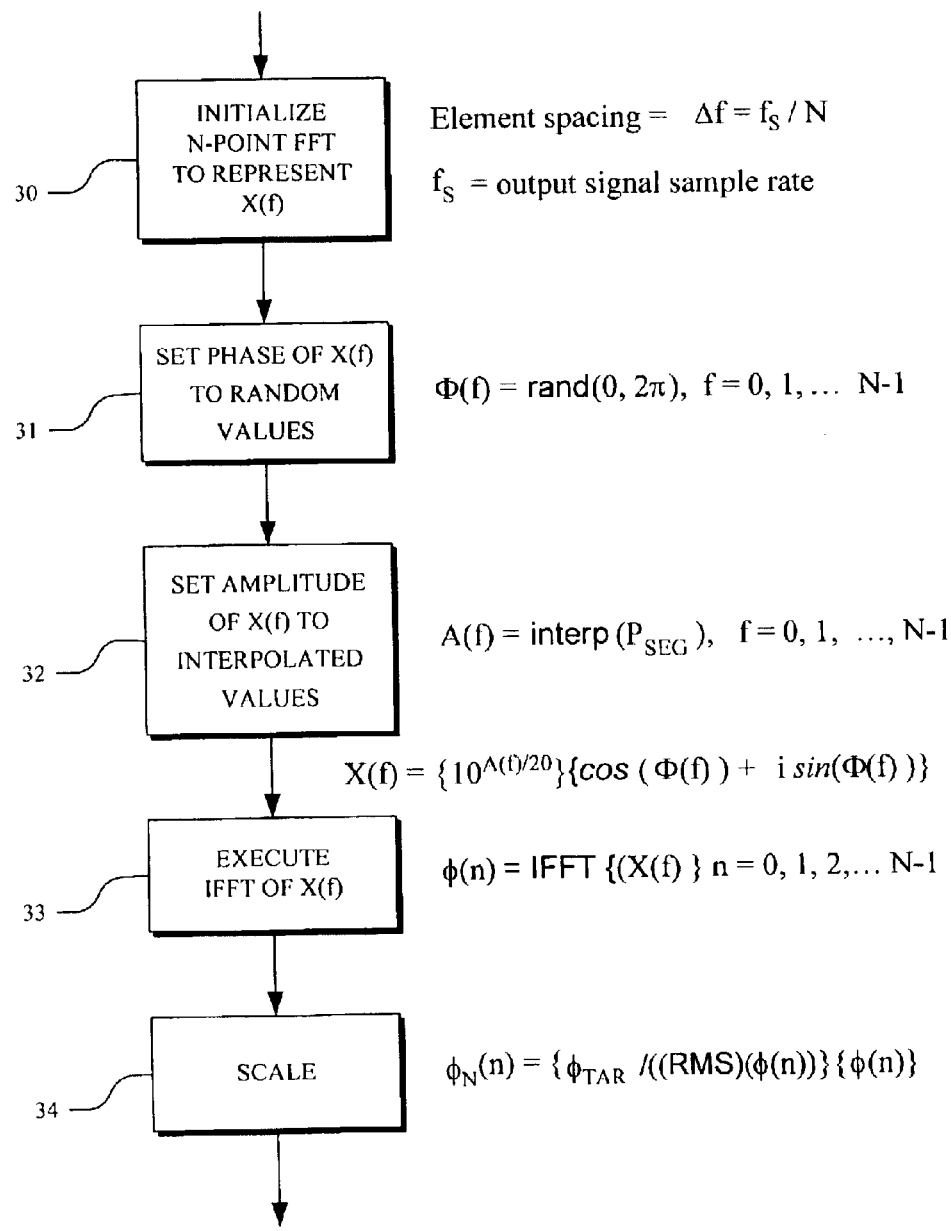

30 — INITIALIZE N-POINT FFT TO REPRESENT X(f)

Element spacing = $\Delta f = f_S / N$ $f_S$ = output signal sample rate

31 — SET PHASE OF X(f) TO RANDOM VALUES $\Phi(f) = \text{rand}(0, 2\pi), \quad f = 0, 1, \ldots N-1$ 32 — SET AMPLITUDE OF X(f) TO INTERPOLATED VALUES $A(f) = \text{interp}(P_{SEG}), \quad f = 0, 1, \ldots, N-1$ $X(f) = \{10^{A(f)/20}\}\{\cos(\Phi(f)) + i\sin(\Phi(f))\}$ 33 — EXECUTE IFFT OF X(f)

$\phi(n) = \text{IFFT}\{(X(f)\} \; n = 0, 1, 2, \ldots N-1$

34 — SCALE $\phi_N(n) = \{\phi_{TAR} /((RMS)(\phi(n)))\}\{\phi(n)\}$

DIGITALLY CONTROLLED ANGLE NOISE SIGNAL GENERATOR

BACKGROUND OF THE INVENTION

The present invention relates to methods and apparatus for generating and using electrical signals with precisely specified and controlled angle noise.

In general, any signal is characterized as having an amplitude and an angle. Any disturbance of the angle of a signal is referred to as angle disturbance. The angle of a signal includes a frequency term, a time term and a phase term. Any disturbance of the frequency term is referred to as frequency noise, any disturbance of the phase term is referred to as phase noise and any disturbance of the time term is referred to as time noise (time jitter). Frequency noise, phase noise and time noise are forms of angle disturbance.

Noise, and particularly phase noise, is a significant deleterious factor for many signals employing various modulation formats used in the communication industry. Phase noise causes the actual signal phase of a generated signal to deviate from the ideal phase of the generated signal. Typically, phase noise in communication systems is a random phenomenon that has higher amplitude at lower noise frequencies than at higher noise frequencies.

Many types of signal modulation formats are adversely affected by noise including, by way of example, Phase Modulation (PM), Frequency Modulation (FM), Phase Shift Keyed (PSK) Modulation and Quadrature Amplitude Modulation (QAM), Quadrature Phase Shift Keyed (QPSK) Modulation, Frequency Shift Keyed (FSK) modulation, Frequency Hopped (FH) modulation and Ultra Wide Band (UWB) modulation.

In general for new communications systems that attempt to transmit more data for a given bandwidth, phase noise significantly affects signal quality and system performance. In order to transmit more data for a given bandwidth, various formats such as high-order PSK or QAM are employed and these formats require low phase noise. Since these formats are often used in an environment of tightly packed channel spacing, the requirements for low phase noise are even more important.

There are many techniques known for reducing phase noise in signal-generating devices. Typical examples are described in U.S. Pat. Nos. 6,072,371, 6,175,284 and 6,236,275. U.S. Pat. No. 6,072,371 employs heterojunction circuit designs to reduce phase noise. U.S. Pat. No. 6,175,284 employs temperature compensated crystal circuit designs to reduce phase noise. U.S. Pat. No. 6,236,275 employs digital frequency synthesis to reduce phase noise. None of these techniques contemplates imparting a specified and known phase noise on the generated output signal.

There are many techniques known for measuring phase noise. Typical examples of methods known for measuring phase noise are described in U.S. Pat. Nos. 6,167,359 and 6,313,619. U.S. Pat. No. 6,167,359 employs non-linear, differential-equation analysis for characterizing phase noise. U.S. Pat. No. 6,313,619 uses a spectrum analyzer for phase noise measurement. None of these known techniques, however, contemplates controlling or generating a signal with specified and accurate phase noise.

A spectrum analyzer is the most common device for measuring phase noise. Typically, a spectrum analyzer includes modules to automate phase noise measurement and operates on a sinusoidal input signal. To measure "true" phase noise, measurement systems should perform a phase demodulation of a generated signal and then measure the power spectrum of the demodulated signal. Such measurement systems, however, are difficult to build and calibrate. Therefore, measurement systems typically assume the phase noise is small and make the small angle approximation, $\sin(x)=x$ and $\cos(x)\equiv 1$. This approximation means the spectrum of the phase noise is approximately the same as the spectrum of the generated signal itself minus the desired tone for a sinusoidal signal. If the phase noise is large, however, this approximation is significantly inaccurate and these measurement systems produce erroneous results. Measured phase noise results are typically plotted in log power (dBc/Hz) versus log frequency.

One well-known method for producing a signal with specified phase noise operates by generating a phase signal and then applies that phase signal to the phase-modulation input of a standard signal generator. This method is described, for example, in the publication "Audio Noise Sources for Generating Phase Noise" by Charles Wenzel, available at the WEB address "http://www.wenzel.com/pdffiles/noise.pdf" as of the date of this application. This method and other known methods are accurate at best only to about +/−1 dB to 2 dB and even to achieve such poor accuracy, these methods are difficult to calibrate. Such poor accuracy and such calibration difficulty are unsatisfactory to meet the needs of communication systems and devices in the communications industry.

Accordingly, in order to meet the needs of the communication industry, improved methods and apparatus for generating and using signals with exact, accurate and specified noise are required.

SUMMARY

The present invention is a digitally controlled angle noise signal generator for generating a signal with precise and accurate noise. The signal generator is formed of a digital noise generator for generating a digital noise signal $\theta_N$, and a digital signal generator for forming an internal signal S. The digital signal generator receives the digital noise signal $\phi_N$ and modulates the internal signal S with the digital noise signal $\phi_N$ to generate a digitally controlled signal $y_g = S m\{\theta_N\}$, where m is the modulation operator, with precise and accurate noise.

In embodiments of the invention, the digital noise generator generates the digital noise signal $\theta_N$ as a phase noise signal, as a frequency noise signal or as a time noise signal.

In some embodiments, the internal signal S is a sine wave and in other embodiments the internal signal S is a modulated signal modulated with a modulation format. Typically, the modulation format is one of the modulation formats Phase Modulation (PM), Frequency Modulation (FM), Phase Shift Keyed (PSK) Modulation and Quadrature Amplitude Modulation (QAM), Quadrature Phase Shift Keyed (QPSK) Modulation, Frequency Shift Keyed (FSK) modulation, Frequency Hopped (FH) modulation and Ultra Wide Band (UWB) modulation.

In some embodiments, the digital noise generator generates the digital noise signal $\theta_N$ as a phase noise signal and digital generates white noise. The white noise is digitally filtered to produce the digital noise signal $\theta_N$ with precise and accurate noise. In one embodiment, the digital filtering is with an infinite impulse response (IIR) filter and in another embodiment, the digital filtering is with a finite impulse response (FIR) filter.

The digitally controlled signal $y_g$ is is further processed in an output processor. In one embodiment, the output processor includes a digital-to-analog converter that forms a converted signal and the converted signal is filtered to provide a filtered signal having accurate and controlled noise.

In some embodiments, the filtered signal has accurate and controlled noise at a first frequency and the first frequency is up-converted to an RF frequency to form an RF signal with precise and accurate noise.

The digitally controlled angle noise signal generator is used in a calibration apparatus for calibrating a noise analyzer. The digitally controlled signal $y_g$ is connected as an input to the noise analyzer to cause an analyzed digital signal to be produced in the noise analyzer. A comparator compares a digital signal from digitally controlled angle noise signal generator with the digital noise signal $\theta_N$ to determine errors in the analyzed digital signal.

The digitally controlled angle noise signal generator is used for testing a communications system. The digitally controlled signal $y_g$ is connected as an input to the communications system. In one embodiment the input is to the local oscillator of the communications system. In another embodiment, the digitally controlled signal $y_g$ is in put to an RF receiver port of the communications system.

In some embodiments, the digital noise generator generates the digital noise signal $\theta_N$ as a phase noise signal and executes an Inverse Fast Fourier Transform of a digital function to produce the digital noise signal $\theta_N$.

The foregoing and other objects, features and advantages of the invention will be apparent from the following detailed description in conjunction with the drawings.

BRIEF DESCRIPTION OF THE DRAWINGS

FIG. 3 presents the details of an algorithm used to generate a phase-noise signal.

DETAILED DESCRIPTION

Figure 1:
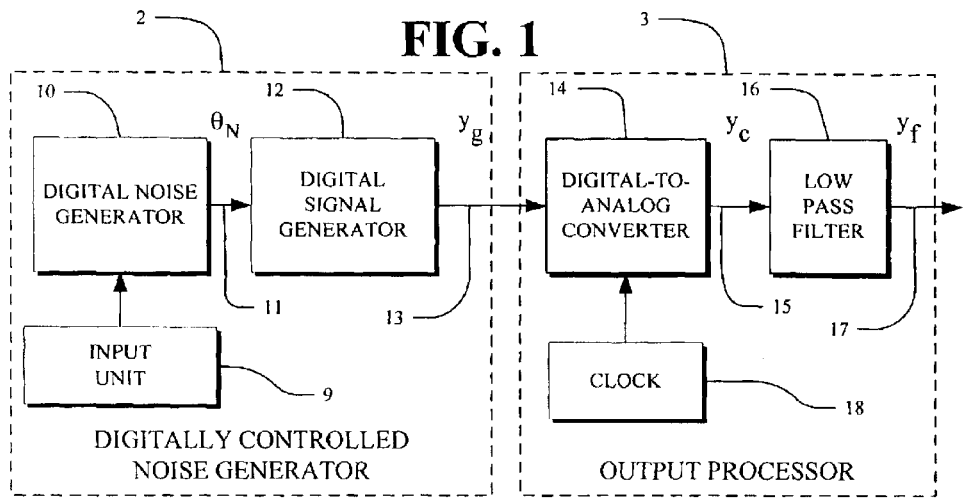
FIG. 1 depicts a block diagram of a signal generator including a digitally controlled phase noise generator and an output processor.

FIG. 1 depicts a block diagram of a digitally controlled noise generator 2 and an output processor 3. The digitally controlled noise generator 2 includes a digital noise generator 10, an input unit 9 and a digital signal generator 12. The output processor 3, in the embodiment of FIG. 1, includes a digital-to-analog converter 14, a clock 18 and a low pass filter 16. The digital noise generator 10 generates a digital noise signal $\theta_N$ on noise generator output 11 that precisely and accurately includes the noise specified by the input unit 18. The noise signal $\theta_N$ on output 11 is input to the digital signal generator 12 for output processing. The digital signal generator 12 forms a signal S that is modulated by the noise signal $\theta_N$ to generate the digital signal generator output signal $y_g$ on output 13. In the FIG. 1 embodiment, the output signal $y_g$ processed in output processor 3 by operation of digital-to-analog converter 14 to form the converted signal $y_c$. The converted signal $y_c$ is filtered in the low pass filter 16 to form the filtered output signal $y_f$ on output 17.

In the digital signal generator 12 of FIG. 1, the output signal $y_g$ is modulated by noise signal $\theta_N$ so that the output signal $y_g$ has the precise and accurate noise characteristics specified by the noise signal $\theta_N$. The output signal $y_g$ from the digital signal generator is given as follows:

$$y_g = S\mathfrak{m}\{\theta_N\} \qquad \text{Eq. (1)}$$

where:

S=internal signal generated by the digital signal generator $y_g$=digital signal generator output signal $\theta_N$=noise signal $\mathfrak{m}$=modulation operator In Eq. (1), the noise signal $\theta_N$ is the angle disturbance of the internal signal S. The noise signal $\theta_N$ in the case of a phase noise disturbance is the phase noise signal $\phi_N(t)$. The noise signal $\theta_N$ in the case of a frequency noise disturbance is the frequency noise signal $\psi_N(t)$ where $\psi_N(t)=2\pi f_D t$ where $f_D$ is the frequency disturbance. The noise signal $\theta_N$ in the case of a time noise disturbance (jitter) is the time noise signal $\tau_N(t)$ where $\tau_N(t)=2\pi f(t_D(t))$ and where $t_D(t)$ is the time jitter.

The internal signal S generated by the digital signal generator 12, and hence the output signal $y_g$, may have many different formats. The format is selected to match the format employed in the particular communications system or other environment in which digitally controlled noise generator 2 is employed. The internal signal S can be any desired format including AM, FM, PSK, QAM, QPSK and many others.

In one example, a QPSK format is generated for signal S. Typically, QPSK format signals are employed in CDMA (Code Division Multiple Access) wireless communications systems. For such CDMA systems, the internal signal S and the output signal $y_g$ for a QPSK format as a function of time are given as follows:

$$S=S(t)=A \sin\{2\pi ft+b(t)(\pi/2)\} \qquad \text{Eq. (2)}$$

$$y_g=y_g(t)=A \sin\{2\pi ft+b(t)(\pi/2)+\phi_N(t)\} \qquad \text{Eq. (3)}$$

where:

S(t)=internal signal $y_g(t)$=digital signal generator output signal

A=signal amplitude f=signal frequency t=time b(t)=0, 1, 2, 3 for data values 00, 01, 10 and 11, respectively $\phi_N(t)$=phase noise embodiment of $\theta_N$ noise signal In another example, the signals are described in connection with sine wave signals. In particular, the internal signal S(t) is given as follows:

$$S(t)=A \sin(2\pi ft) \qquad \text{Eq. (4)}$$

where:

S(t)=internal signal

A=signal amplitude f=signal frequency t=time

For the internal signal S(t) of Eq. (4), the output signal $y_g(t)$ is given as follows:

$$y_g(t) = A \sin\{2\pi(f+f_D(t))(t+t_D(t))+\phi_N(t)\} \qquad \text{Eq. (5)}$$

where:

S(t)=internal signal
$y_g(t)$=output signal
A=signal amplitude
f=signal frequency
$f_D(t)$=frequence disturbance (frequence noise)
t=time
$t_D(t)$=time disturbance (time noise, "jitter")
$\phi_N(t)$=phase noise Considering the output signal of Eq. (5) where only phase noise is present, $y_g(t)$ is given as follows:

$$y_g(t) = A \sin\{2\pi f t + \phi_N(t)\} \qquad \text{Eq. (6)}$$

where:

S(t)=internal signal
$y_g(t)$=output signal
A=signal amplitude
f=signal frequency
t=time
$\phi_N(t)$=phase noise Phase noise may be defined by any number of different functions. For example, phase noise $\phi_N(t)$ specified as a simple sinusoid at frequency $f_N$ and maximum amplitude $\phi_{MAX}$ is represented as follows:

$$\phi_N(t) = \phi_{MAX} \sin(2\pi f_N t) \qquad \text{Eq. (7)}$$

where:

$\phi_N(t)$=phase noise (radians)
$f_N$=phase noise frequency (cycles/second)
t=time (seconds)
$\phi_{MAX}$=maximum phase noise amplitude (radians)

The phase noise plot of the Eq. (7) signal has a single spike at phase noise frequence $f_N$ Hz.

Figure 2:
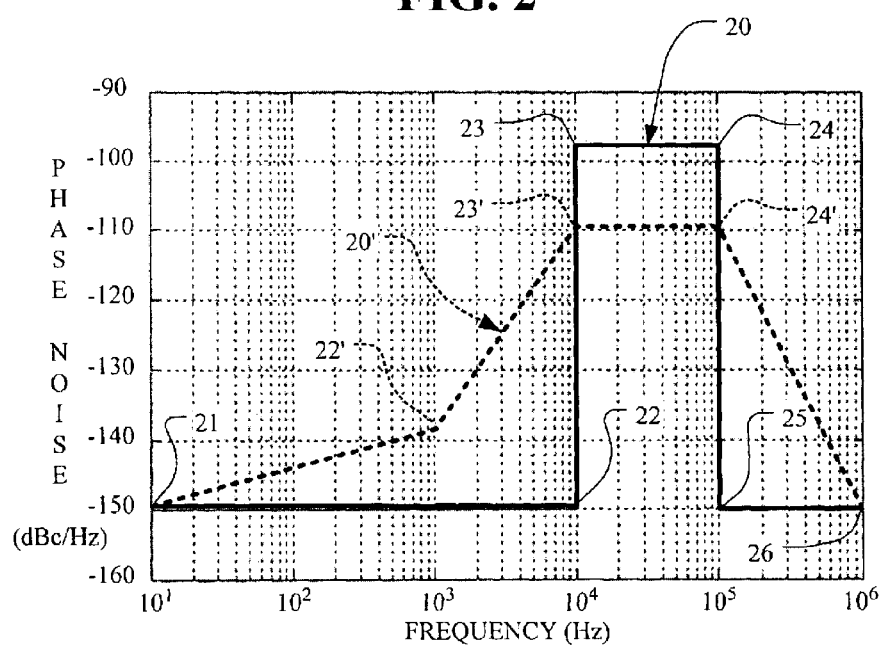
FIG. 2 depicts a typical target spectrum for specifying a digitally generated signal accurate phase-noise characteristics.

In FIG. 2, a more complex phase noise function 20 is shown. The phase noise function 20 is a step function with low phase noise for frequencies below $10^4$ Hz, phase noise of −98 dBc/Hz for frequencies from $10^4$ Hz to $10^5$ Hz and low phase noise for frequencies above $10^5$ Hz.

The phase noise $\phi_N(t)$ for the function 20 of FIG. 2 is represented as follows:

$$\phi_N(t) = -150@(f_{21}-f_{22}); -98@(f_{23}-f_{24}); -150@(f_{25}-f_{26}) \qquad \text{Eq. (8)}$$

where:

$\phi_N(t)$=phase noise (radians)
$@(f_{21}-f_{22})$=frequency range from $10^1$ Hz to $10^4$ Hz
$@(f_{23}-f_{24})$=frequency range from $10^4$ Hz to $10^5$ Hz
$@(f_{25}-f_{26})$=frequency range from $10^5$ Hz to $10^6$ Hz
t=time (seconds)

The digital phase noise generator 10 is flexible and accurate and is capable of generating phase noise according to an unlimited number of functions specified by the input unit 9 where the Eq. (7) and Eq. (8) functions are shown for purposes of example. By way of contrast, analog phase noise generators are not able to generate noise functions with the flexibility and accuracy of the digitally controlled phase noise generator. In analog systems, as a practical matter it is impossible to have phase noise change rapidly from one frequency to another frequency due to the bandwidth limitations of analog filters. Therefore, analog systems cannot create the phase noise function of FIG. 2 with the step changes in phase noise at $10^4$ Hz and $10^5$ Hz. In an analog system, the transitions at $10^4$ Hz and $10^5$ Hz would not be step functions but would be rounded in a relatively wide transition region.

The digital phase noise generator 10 is a digital processor which, for example, can be any well-known general-purpose computer or any special-purpose processor for generating arbitrary or defined mathematical functions of the type described in the present specification. In a typical embodiment in which generator 10 is a general-purpose computer, generator 10 executes MATLAB®, or any other conventional application program, that facilitates mathematical calculations of the type described in the present specification.

In order to generate complex phase noise functions, the noise signals are typically characterized by their Fourier transforms that include a large number of component sinusoids. When the sinusoids have random phase, a Gaussian distributed noise signal is formed. The amplitudes of the sinusoids determine the phase noise spectrum.

In FIG. 3, the steps performed in the operation of digital phase noise generator 10 are depicted. The digital phase noise generator 10 operates to process an inverse transform, such as the Inverse Fast Fourier Transform (IFFT), on an internal function, X(f). The input parameters from the input unit 9 are used to define the internal function, X(f), as follows:

$$X(f) = \{10^{A(f)/20}\}\{\cos \Phi(f) + i \sin(\Phi(f))\} \qquad \text{Eq. (9)}$$

where,

X(f)=the internal function
A(f)=amplitude of the internal function at the bin frequency f in dB
$\Phi(f)$=phase of the internal function at the bin frequency f
f=bin frequency Step 30 generates an N-point complex array of elements. The input unit 9 of FIG. 1 specifies the data values of input parameters that characterize the phase noise function in the frequency domain. To generate the N-point complex array of elements corresponding to the frequency bins of the phase noise function spectrum, the bin spacing is $f_S/N$ where $f_S$ is the sampling rate and N is the IFFT size.

Step 31 sets the phase, $\Phi(f)$, of each bin for the internal function X(f) with uniformly varying random numbers between 0 and $2\pi$. That is, $\Phi(f)$=rand $(0,2\pi)$ for f=1, 2, ..., N−1, N where rand is a randomizing operator.

Step 32 sets the amplitude, A(f), of each bin for the internal function X(f) based upon the input specification. The digital phase noise generator 10 interpolates the input data linearly in the log domain for the frequencies, f, between the break points. That is, A(f)=interp ($P_{SEG}$) for f=0,1, ..., N−1 where interp is an interpolation operator and where $P_{SEG}$ is the segment values in the log dB domain. An example segment is the line from 22' to 23' in FIG. 2.

The IFFT function 33 executes the IFFT on X(f) to calculate the real signal $\Phi(n)$. To ensure the output signal, $\Phi(n)$, is a real signal, the negative frequency bins of X(f) must be filled with the conjugate of the positive frequency bins created prior to the IFFT step. The actual placement of these bins in the IFFT array depends on the IFFT algorithm employed. The phase noise signal, $\Phi(n)$, is generated according to Eq. (10) as follows:

$$\Phi(n) = IFFT\{X(n)\}, n=0, 1, \ldots, N-1 \qquad \text{Eq. (10)}$$

Step 34 scales the array to set the phase noise to the target level, $\phi_{TAR}$. The value of target level, $\phi_{TAR}$, establishes the amount of phase noise in the signal.

The digital phase signal $\phi_N(n)$ determined by the algorithm of FIG. 3 is input to the digital signal generator 12 that generates the digital modulated signal $y_g$ as $y_g(n)$ by performing the following equation:

$$y_g(n)=G \sin(2 \pi n f_C/f_S+\phi_N(n))) \quad \text{Eq. (11)}$$

where,

G=amplitude=$2^{(BITS/2-1)}-1$
BITS=number of bits of resolution of the DAC.
$f_C$=carrier frequency (Hz)
$f_S$=sample rate (samples per second)
n=0, 1, 2, . . . , N–1, N is the number of samples in the phase noise signal The processing in the digitally controlled phase noise generator is described in connection with FIG. 2. For the phase noise function 20 of FIG. 2, the inputs are the frequencies and amplitudes at the frequency break points 21 to 26 as indicated in FIG. 2 and in the following TABLE 1.

TABLE 1

|  | 21 | 22 | 23 | 24 | 25 | 26 |
|---|---|---|---|---|---|---|
| f (Hz) | $10^1$ | $10^4$ | $10^4 + 1$ | $10^5$ | $10^5 + 1$ | $10^6$ |
| A (dBc/Hz) | −150 | −150 | −98 | −98 | −150 | −150 |

As indicated in TABLE 1 and FIG. 2, high phase noise is present from $10^4$ Hz to $10^5$ Hz and low phase noise is present at other frequencies. A complex array corresponding to the phase noise spectrum is set to have a magnitude of 1.0 and to have random phase for the bins corresponding to the range from $10^4$ Hz to $10^5$ Hz. Using $f_S$ with a 50 MHz sample rate and N=$2^{17}$=131072. For the N-point IFFT, the bins are int{((f)(N)/$f_S$)+1} where int is the integer operator.

For $10^4$ Hz, int{((f)(N)/$f_S$)+1}=int{(($10^4$)(131072)/(50×$10^6$))+1}=263 and for $10^5$ Hz, int{((f)(N)/$f_S$)+1}=int{(($10^5$)(131072)/(50×$10^6$))+1}=2622. All other bins are set to 0.

Amplitudes, A(f), are calculated at all bin frequencies. The calculation interpolates values according to A(f)=interp ($P_{SEG}$). Referring to FIG. 2, the term $P_{SEG}$ is the value on the PHASE NOISE axis at each bin frequency along the FREQUENCY axis of each segment forming the phase noise function. For FIG. 2, the $P_{SEG}$ values are $P_{SEG}$(21–22), $P_{SEG}$(23–24) and $P_{SEG}$(25–26). No actual interpolation is required for the noise function 20 since each segment for all bin frequencies for that segment has the same value. However, referring to the noise function 20' in FIG. 2, the $P_{SEG}$ values are $P_{SEG}$(21–22'), $P_{SEG}$(22'–23'), $P_{SEG}$(23'–24') and $P_{SEG}$(24'–26) and the segments $P_{SEG}$(21–22'), $P_{SEG}$(22'–23') and $P_{SEG}$(24'–26) require interpolation. The interpolated amplitude values, A(f), are converted from log dB to linear power to apply to the IFFT bin amplitudes by the calculation $10^{A(f)/20}$ which together with the random phase values $\Phi(f)$ complete the internal function X(f)={$10^{A(f)/20}$}{cos $\Phi(f)$+i sin($\Phi(f)$} of Eq. (10) processed by the IFFT.

The signal generation concepts described for generating phase noise are directly applied for generating frequency noise or time jitter. For time jitter, the time term $t_N(n)$ is an output of IFFT step 33 of FIG. 3 and is scaled in step 34 to set the desired RMS jitter, $t_{TAR}$. The scaling is as follows:

$$t_N(n)=\{t_{TAR}/((RMS)(t_N(n))\}(t_N(n))\} \quad \text{Eq. (12)}$$

With the processing of the example of FIG. 2 in the digitally controlled phase generator 2, the output processor 3 used 12 bits for the DAC 14, clocked at 50 Msamples/second, and the low pass filter 16 was set at 15 MHz to generate the filtered analog signal, $y_f(n)$.

The advantages of the digital architecture include flexibility and accuracy in generating the specified phase noise signal. The digital signal generation allows generation of direct modulation with phase noise applied. As described, the digital architecture can generate simple sine waves or complex communications signals, such as QPSK and QAM, with direct phase noise eliminating the need for external complex modulators. Since the magnitude of the phase noise is imparted mathematically on the signal, the phase noise accuracy has exceeded 0.1 dB. The phase noise floor achieved is a function of the precision of the DAC 14 and clock 18. The DAC clock 18 preferably provides a clean, precise clock signal with low phase noise.

Figure 4:
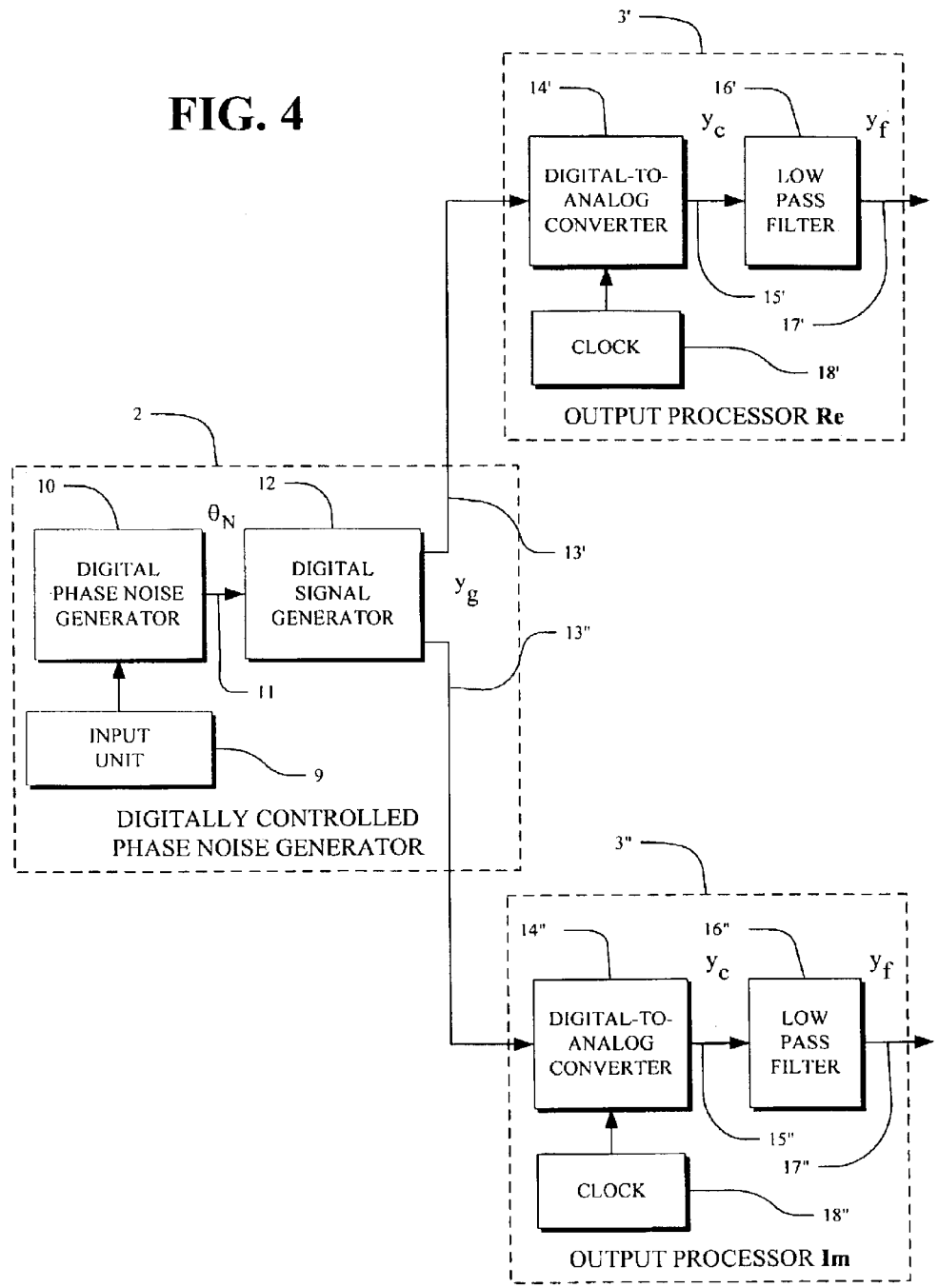
FIG. 4 depicts a block diagram of an embodiment where the digital signal from the digitally controlled phase noise generator is output in complex format.

In FIG. 4, an alternate embodiment is shown where the digital signal from the digitally controlled noise generator 2 is output in complex format with the real (Re) output on line 13' and the imaginary (Im) output on line 13". This embodiment is suitable for directly driving the I and Q phases of I/Q modulators to produce radio frequency (RF) signals. In FIG. 4, the digitally controlled noise generator 2 includes a digital phase noise generator 10, an input unit 9 and a digital signal generator 12 like that of FIG. 1. Two output processors 3' and 3" receive the real (Re) output on line 13' and the imaginary (Im) output on line 13", respectively. The two output processors 3' and 3" include digital-to-analog converters 14' and 14", clocks 18' and 18" and low pass filters 16' and 16", respectively. Typically, the clocks 18' and 18" are from the same clock source and the filters 16' and 16" are matched.

Another embodiment is employed to efficiently generate signals with the lowest sample rate that will produce the signal with the desired bandwidth. For example, if the highest phase noise frequency of interest is 1 MHz and it is to be applied to a sine wave to act as a local oscillator (LO), a 3 MHz sample rate can be used to generate the signal. Many communications systems use 70 MHz as the intermediate frequency (IF) used to step up from baseband signals to RF signals. The desired phase noise on the analog RF signal for such communications systems is achieved by having the signal with phase noise from the digitally controlled noise generator 2 of FIG. 1 function as the LO for the IF frequency. In such an embodiment, the LO signal is generated with a frequency a little below 70 MHz. To do this, the sample rate is increased to about 180 MHz. To increase the sample rate from 3 MHz to 180 MHz requires an interpolation by a factor of 60. Following the interpolation process, the signal carrier is changed to the LO frequency of interest by multiplying the signal by a complex exponential, or digital LO and band pass filtered, to eliminate the negative frequency image if present.

In one embodiment for Radio Frequency (RF) operation, a very fast DAC is used to generate the RF signal directly. This embodiment is effective with current technology to about 200 MHz RF with low generated phase noise using a 12-bit DAC or about 600 MHz RF with higher generated phase noise using an 8-bit DAC.

In another embodiment, a sine wave is generated with the specified phase noise at an intermediate frequency to use as the local oscillator in the process to up convert the desired signal to a higher frequency. This technique can support the standard 70 MHz IF with either 12 or 14 bit DACs.

In another embodiment, the modulated signal is generated at a low frequency with the DAC and up-converted with a conventional frequency up-converter system using LO's with phase noise significantly lower than the phase noise generated on the signal.

In another embodiment, the complex signal is digitally generated centered at DC with the specified phase noise. In the manner of FIG. 4, two DACs are employed to process the real and complex parts of the signal. The two signals are applied to the I and Q inputs of an I/Q modulator to convert to RF using carrier signal LO's with phase noise significantly lower than the phase noise of the digitally generated signal.

In another embodiment, the phase noise function, $\phi_N(n)$ at 11 can be generated using a digital noise generator and digital filter as an alternative to using the IFFT algorithm of FIG. 3. The steps include generating Gaussian random numbers representing white noise from DC to Nyquist (fs/2) and filtering the white noise in the time domain with a digital filter having the amplitude vs. frequency response of the desired noise spectrum, for example, the spectrum of function 20 in FIG. 2.

The digital filter can be either an infinite impulse response (IIR) or finite impulse response (FIR) filter. An IIR filter requires fewer calculations than an FIR filter, however, it is more difficult to design to an arbitrary frequency response. IIR filters also have non-linear phase responses that can impact the phase noise.

FIR filters can be created to approximate arbitrary frequency response functions. The degree of accuracy is a function of the number of filter taps. To have FIR filters produce the desired function 20 with high accuracy requires a large number of taps and calculations. The FIR filters can be designed to have linear phase so the phase noise will not be colored from the desired characteristics.

The filtered noise data is scaled to the desired level in the same manner as the IFFT scaling function 34 described in connection with FIG. 3.

Figure 5:
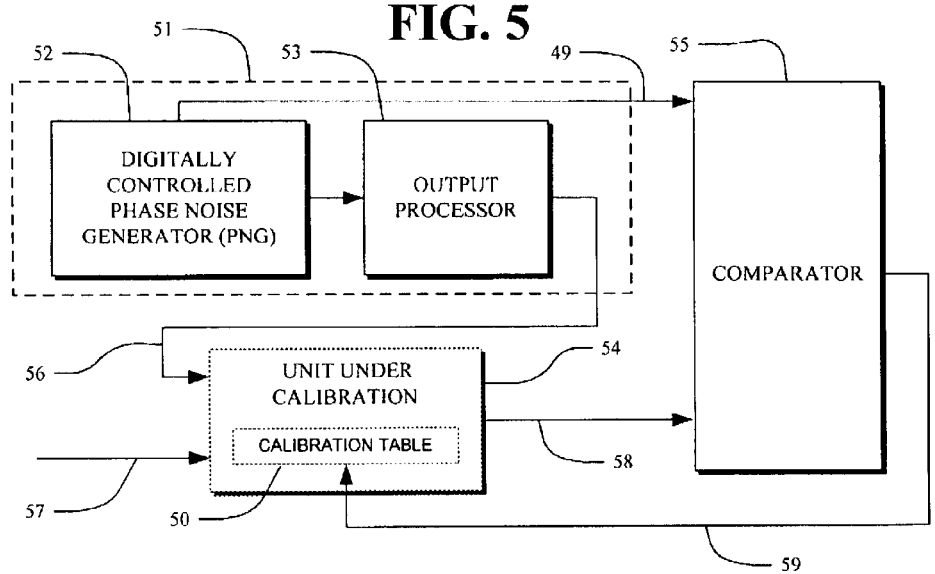
FIG. 5 depicts a block diagram of a signal generator including a digitally controlled phase noise generator for calibration.

FIG. 5 depicts a block diagram of a signal generator 51 including a digitally controlled phase noise generator 52 and an output processor 53 for calibrating the unit 54. The unit 54 under calibration is a phase noise analyzer in need of calibration. Currently available phase noise generators have analog modulators to generate signals that are at best accurate to +/−1 dB when the effort is expended to calibrate the equipment well. Currently available phase noise generators are used as the signal source to calibrate phase noise analyzers; but the calibration results can be no better than the calibration source. The result is that phase noise analyzers are typically only accurate to +/−1 to 2 dB. The digitally controlled phase noise generator 52, like the generator 10 of FIG. 1 is accurate to better than 0.1 dB and does not require calibration. The digitally controlled phase noise generator 52 is used, for example, to calibrate phase noise analyzers and phase noise generators.

In FIG. 5, the signal generator 51 provides, on output 56, the filtered signal $y_f$. The signal $y_f$ is of the type described in connection with the signal on line 17 of FIG. 1. The signal $y_f$ includes the imbedded phase noise and is provided as an input to the unit 54 under calibration. Unit 54 analyzes the noise on input 56 and characterizes that noise on output 58 that forms one input to comparator 55. Typically, the output on 58 is an ASCII or other digital file. The generator 52 provides A(f) values, or other digital representations of the noise function, the same as input to the unit 54 under calibration, on line 49 to provide an input to comparator 55. Comparator 55 determines the difference between the actual reeding and the reading of the system. In certain embodiments, these differences are programed into the analyzer 54 and stored in calibration table 50. After calibration and unit 54 is removed from the calibration operation, an input signal on line 57 to the analyzer 54 is analyzed and after the analysis, the calibration table 50 is used to correct the results of the analysis. In this manner, the unit 54 is able to produce corrected and accurate phase noise values.

The digitally controlled noise generator 2 of FIG. 1 is used to design and test modem communications systems. With modem digital modulation techniques, signal phase noise has become a critical specification. It is desirable to simulate communication systems prior to final designs to detect problems and make design enhancements.

When designing communication systems, the local oscillators, LO's, used in any frequency conversion are one of the most expensive and sensitive components to the overall system performance. The frequency conversions occur in a communication system in transmitter, repeater and receiver subsystems. For example, a communication satellite system may have one or more of each of these subsystems. A direct broadcast TV system is a good example of such communications systems. The ground station uplink from the studio is the transmitter, the satellite is the repeater and the set top boxes in the homes are the receivers. In designing such a communications system, it is desirable to test each of these three subsystems as well as all three together before building the final system and before launching the satellite.

The digitally controlled noise generator 2 of FIG. 1 is used to generate the sinusoidal local oscillators for system simulation, for testing subsystems and for testing entire systems. The digitally controlled noise generator 2 is used to change the phase noise characteristics so that the impact of phase noise on the system performance can be determined. The range of phase noise is simulated and the results allow the specification for the LO's to be improved or verified. Without this simulation step, the engineers are usually forced to over specify the LO's resulting in more costly products.

Figure 6:
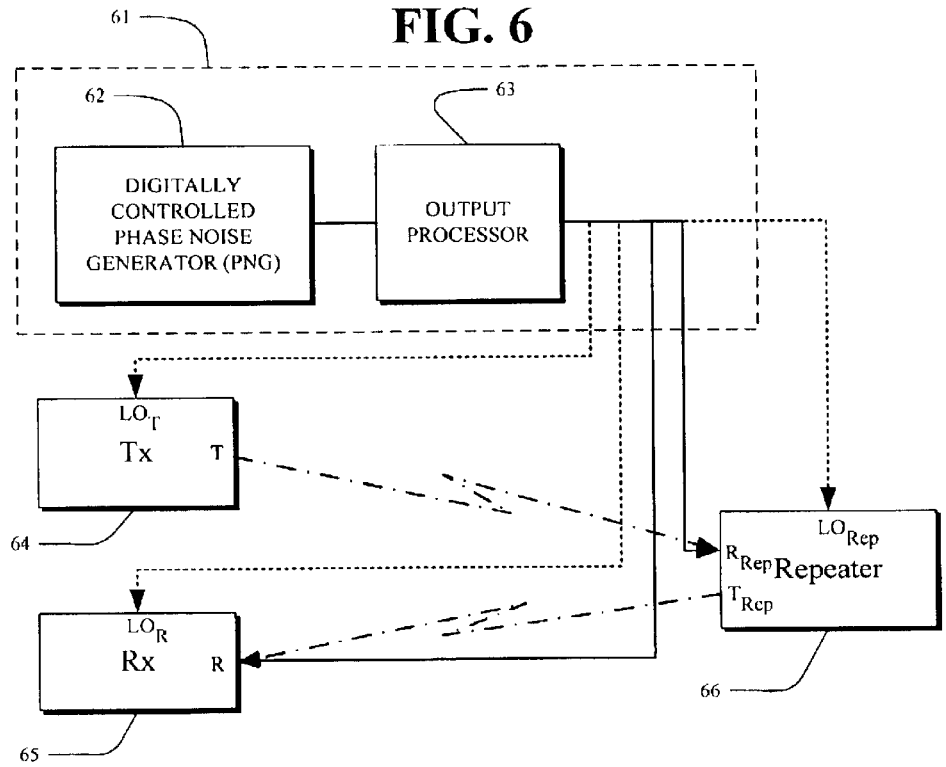
FIG. 6 depicts a block diagram of a signal generator including a digitally controlled phase noise generator for communications system design.

FIG. 6 depicts a block diagram of a signal generator 61 including a digitally controlled phase noise generator 62 and an output processor 63 deployed for communications system design. When local oscillator functions of the transmitter 64, receiver 65 and repeater 66 are to be tested, the output from the digitally controlled phase noise generator 62 is fed into the local oscillator inputs $LO_T$, $LO_R$ and $LO_{REP}$ of the of the transmitter 64, receiver 65 and repeater 66, respectively. When RF functions of the receiver 65 and repeater 66 are to be tested, the RF output from output processor 63 are fed into to the RF inputs R and $R_{REP}$ of the of the receiver 65 and repeater 66, respectively. When fed to the receiver 65 and repeater 66, the signal from the output processor 63 is sinusoidal or modulated and includes the desired phase noise.

By using the digitally controlled noise generator 2 of FIG. 1 to generate a modulated signal with prescribed phase noise characteristics, the repeater or receiver of a communications system can be tested without a transmitter. For example, for testing the receiver for an 802.11A wireless local area network system, the phase noise generator directly generates the desired COFDM signal with the phase noise expected with the 802.11A transmitter. The phase noise is added to the COFDM signal in software as the signal is generated.

Engineers often simulate subsystems or full systems in software prior to building a hardware prototype or product. The digital form of the signal 13 or other signals from the signal generator can be used to either simulate the LO or to simulate modulated signals for these simulation efforts.

While the invention has been particularly shown and described with reference to preferred embodiments thereof it will be understood by those skilled in the art that various changes in form and details may be made therein without departing from the scope of the invention.

What is claimed is:

1. A digitally controlled angle noise signal generator comprising:
   a digital noise generator for generating a digital noise signal $\theta_N$,
   a digital signal generator for forming an internal signal S, for receiving the digital noise signal $\phi_N$ and for modulating the internal signal S with the digital noise signal $\phi_N$ to generate a digitally controlled signal $y_g = S\mathfrak{m}\{\theta_N\}$ where $\mathfrak{m}$ is the modulation operator.

2. The generator of claim 1 wherein said digital noise generator generates said digital noise signal $\theta_N$ as a phase noise signal.

3. The generator of claim 1 wherein said digital noise generator generates said digital noise signal $\theta_N$ as a frequency noise signal.

4. The generator of claim 1 wherein said digital noise generator generates said digital noise signal $\theta_N$ as a time noise signal.

5. The generator of claim 1 wherein said internal signal S is a sine wave.

6. The generator of claim 1 wherein said internal signal S is a modulated signal modulated with a modulation format.

7. The generator of claim 6 wherein said modulation format is one of the modulation formats Phase Modulation (PM), Frequency Modulation (FM), Phase Shift Keyed (PSK) Modulation and Quadrature Amplitude Modulation (QAM), Quadrature Phase Shift Keyed (QPSK) Modulation, Frequency Shift Keyed (FSK) modulation, Frequency Hopped (FH) modulation and Ultra Wide Band (UWB) modulation.

8. The generator of claim 1 wherein said digital noise generator generates said digital noise signal $\theta_N$ as a phase noise signal and includes digitally generating white noise and digital filtering of the white noise to produce the digital noise signal $\theta_N$.

9. The generator of claim 8 wherein said digital filtering is with an infinite impulse response (IIR) filter.

10. The generator of claim 9 wherein said digital filtering is with a finite impulse response (FIR) filter.

11. The generator of claim 1 wherein said digital noise generator generates said digital noise signal $\theta_N$ as a phase noise signal and executes an Inverse Fast Fourier Transform of a digital function to produce the digital noise signal $\theta_N$.

12. The generator of claim 11 wherein said digital function is formed using sinusoids having random phase.

13. The generator of claim 11 wherein said digital function is formed using sinusoids having amplitudes set by an input noise spectrum.

14. The generator of claim 11 wherein said digital function is selected so that the Inverse Fast Fourier Transform is a real number and said digital noise signal $\theta_N$ is equal to the real number.

15. The generator of claim 14 wherein said digital noise signal $\theta_N$ is scaled to establish the magnitude of the phase noise.

16. The generator of claim 1 wherein said internal signal S is a modulated signal modulated with a modulation format and with a sampling frequency and wherein said digital noise signal $\theta_N$ is sampled with said sampling frequency.

17. The generator of claim 1 wherein said digitally controlled signal $y_g$ is digital-to-analog converted to form a converted signal and where said converted signal is filtered to provide a filtered signal having accurate and controlled noise.

18. The generator of claim 1 wherein said digitally controlled signal $y_g$ is digital-to-analog converted to form a converted signal and where said converted signal is filtered to provide a filtered signal having accurate and controlled noise at a first frequency and wherein said first frequency is up-converted to an RE frequency to form an RF signal with precise and accurate noise.

19. A calibration apparatus for calibrating a noise analyzer comprising,
   a digitally controlled angle noise signal generator including,
      a digital noise generator for generating a digital noise signal $\theta_N$,
      a digital signal generator for forming an internal signal S, for receiving the digital noise signal $\phi_N$ and for modulating the internal signal S with the digital noise signal $\phi_N$ to generate a digitally controlled signal $y_g = S\mathfrak{m}\{\theta_N\}$ where $\mathfrak{m}$ is the modulation operator,
   connection means for connecting the controlled signal $y_g$ as an input to the noise analyzer to cause an analyzed digital signal from the noise analyzer,
   a comparator for comparing a digital signal from digitally controlled angle noise signal generator with the digital noise signal $\theta_N$ to determine errors in the analyzed digital signal.

20. An apparatus for testing a communications system comprising,
   a digitally controlled angle noise signal generator including,
      a digital noise generator for generating a digital noise signal $\theta_N$,
      a digital signal generator for forming an internal signal S, for receiving the digital noise signal $\phi_N$ and for modulating the internal signal S with the digital noise signal $\phi_N$ to generate a digitally controlled signal $y_g = S\mathfrak{m}\{\theta_N\}$ where $\mathfrak{m}$ is the modulation operator,
   connection means for connecting the digitally controlled signal $y_g$ as an input to the communications system.

21. The apparatus of claim 20 wherein said digitally controlled signal $y_g$ is in put to the local oscillator of the communications system.

22. The apparatus of claim 20 wherein said digitally controlled signal $y_g$ is in put to an RF receiver port of the communications system.

* * * * *